(12) United States Patent
Mears et al.

(10) Patent No.: US 7,109,052 B2
(45) Date of Patent: Sep. 19, 2006

(54) METHOD FOR MAKING AN INTEGRATED CIRCUIT COMPRISING A WAVEGUIDE HAVING AN ENERGY BAND ENGINEERED SUPERLATTICE

(75) Inventors: Robert J. Mears, Wellesley, MA (US); Robert John Stephenson, Newton Upper Falls, MA (US)

(73) Assignee: RJ Mears, LLC, Waltham, MA (US)

( * ) Notice: Subject to any disclaimer, the term of this patent is extended or adjusted under 35 U.S.C. 154(b) by 0 days.

(21) Appl. No.: 10/936,920

(22) Filed: Sep. 9, 2004

(65) Prior Publication Data
US 2005/0032260 A1    Feb. 10, 2005

Related U.S. Application Data

(63) Continuation-in-part of application No. 10/647,069, filed on Aug. 22, 2003, now Pat. No. 6,897,472, which is a continuation-in-part of application No. 10/603,696, filed on Jun. 26, 2003, now abandoned, and a continuation-in-part of application No. 10/603,621, filed on Jun. 26, 2003.

(51) Int. Cl.
*H01L 21/00* (2006.01)
(52) U.S. Cl. ......................... 438/31; 438/223
(58) Field of Classification Search ............... 438/31, 438/145, 223, 227, 228
See application file for complete search history.

(56) References Cited

U.S. PATENT DOCUMENTS

| | | | |
|---|---|---|---|
| 4,485,128 A | 11/1984 | Dalal et al. ............. | 427/85 |
| 4,594,603 A | 6/1986 | Holonyak, Jr. ............ | 357/16 |
| 4,882,609 A | 11/1989 | Schubert et al. .......... | 357/22 |
| 4,908,678 A | 3/1990 | Yamazaki ................ | 357/4 |
| 4,937,204 A | 6/1990 | Ishibashi et al. .......... | 437/110 |
| 4,969,031 A | 11/1990 | Kobayashi et al. ......... | 357/63 |
| 5,055,887 A | 10/1991 | Yamazaki ................ | 357/4 |
| 5,081,513 A | 1/1992 | Jackson et al. ........... | 357/23.7 |
| 5,107,306 A * | 4/1992 | Blood et al. ............. | 257/11 |
| 5,216,262 A | 6/1993 | Tsu ...................... | 257/17 |
| 5,357,119 A | 10/1994 | Wang et al. ............. | 257/18 |
| 5,371,812 A * | 12/1994 | Nakamura ............... | 385/9 |
| 5,606,177 A | 2/1997 | Wallace et al. ........... | 257/25 |
| 5,683,934 A | 11/1997 | Candelaria ............... | 437/134 |
| 5,684,817 A | 11/1997 | Houdre et al. ............ | 372/45 |
| 5,994,164 A | 11/1999 | Fonash et al. ............ | 438/97 |

(Continued)

FOREIGN PATENT DOCUMENTS

EP    0696747    2/1996

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Phuc T. Dang
(74) *Attorney, Agent, or Firm*—Allen, Dyer, Doppelt, Milbrath & Gilchrist, P.A.

(57) ABSTRACT

A method for making an integrated circuit may include forming at least one active optical device and a waveguide coupled thereto. The waveguide may include a superlattice including a plurality of stacked groups of layers. Each group of layers of the superlattice may include a plurality of stacked base semiconductor monolayers defining a base semiconductor portion and an energy band-modifying layer thereon. The energy-band modifying layer may include at least one non-semiconductor monolayer constrained within a crystal lattice of adjacent base semiconductor portions.

30 Claims, 14 Drawing Sheets

U.S. PATENT DOCUMENTS

| | | | |
|---|---|---|---|
| 6,058,127 A | 5/2000 | Joannopoulos et al. | 372/92 |
| 6,069,394 A * | 5/2000 | Hashimoto et al. | 257/466 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B1 | 10/2002 | Takagi | 257/77 |
| 6,498,359 B1 | 12/2002 | Schmidt et al. | 257/190 |
| 6,501,092 B1 | 12/2002 | Nikonov et al. | 257/29 |
| 6,521,549 B1 | 2/2003 | Kamath et al. | 438/786 |
| 6,566,679 B1 | 5/2003 | Nikonov et al. | 257/29 |
| 6,621,097 B1 | 9/2003 | Nikonov et al. | 257/17 |
| 2003/0034529 A1 | 2/2003 | Fitzgerald et al. | 257/369 |
| 2003/0057416 A1 | 3/2003 | Currie et al. | 257/19 |
| 2003/0162335 A1 | 8/2003 | Yuki et al. | 438/151 |
| 2003/0215990 A1 | 11/2003 | Fitzgerald et al. | 438/172 |

FOREIGN PATENT DOCUMENTS

| | | |
|---|---|---|
| EP | 0703476 | 3/1996 |
| EP | 0793121 | 9/1997 |
| EP | 0 843 361 | 5/1998 |
| GB | 2347520 | 9/2000 |
| JP | 61145820 | 7/1986 |
| JP | 61220339 | 9/1986 |
| WO | 99/63580 | 12/1999 |
| WO | 02/103767 | 12/2002 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Patent Abstracts of Japan, vol. 012, No. 080 (E-590), Mar. 12, 1988 & JP 62 219665 A (Fujitsu Ltd), Sep. 26, 1987 abstract.

Patent Abstracts of Japan, vol. 010, No. 179 (E-414), Jun. 24, 1986 & JP 61 027681 A (Res Dev Corp of Japan), Feb. 7, 1986 abstract.

A.T. Fiory et al., "*Light Emission from Silicon: Some Perspectives and Applications*", Journal of Electronic Materials, vol. 32, No. 10, 2003, pp. 1043-1051.

"Structure of MBE grown semiconductor - atomic superlattices", Tsu et al., Journal of Crystal Growth, Elsevier, Amsterdam, NL, vol. 227-228, Jul. 2001, pp. 21-26, XP004250792, ISSN: 0022-0248.

A Exploration for Si-based Superlattices Structure with Direct Band-gap, Huang et al., Mar. 29, 2001, XP002357978, available at http://phys.cts.nthu.edu.tw/workshop/ESC/mchuang.pdf.

"Transport through a nine period silicon/oxygen superlattice", Applied Physics Letters, AIP, American Institute of Physics, Melville, NY, US, vol. 79, No. 6, Aug. 6, 2001, pp. 788-790, XP012029987, ISSN: 0003-6951.

"Silicon-Based Optoelectronics", Proceedings of the IEEE, IEEE. New York, US, vol. 81, No. 12, Dec. 1, 1993, pp. 1687-1706, XP000426344, ISSN: 0018-9219.

* cited by examiner

US 7,109,052 B2

METHOD FOR MAKING AN INTEGRATED CIRCUIT COMPRISING A WAVEGUIDE HAVING AN ENERGY BAND ENGINEERED SUPERLATTICE

CROSS-REFERENCE TO RELATED APPLICATIONS

This application is a continuation-in-part of U.S. patent application Ser. 10/647,069 filed Aug. 22, 2003 now U.S. Pat. No. 6,897,472, which in turn is a continuation-in-part of U.S. patent application Ser. Nos. 10/603,696 (ABN) and 10/603,621, both filed on Jun. 26, 2003, the entire disclosures of which are hereby incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391–402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are also disclosed as possible to be designed into the material.

Despite considerable efforts at materials engineering to increase the mobility of charge carriers and provide enhanced optical characteristics in semiconductor devices, there is still a need for greater improvements.

SUMMARY OF THE INVENTION

In view of the foregoing background, it is therefore an object of the present invention to provide a method for making an integrated circuit including a waveguide with enhanced energy band engineered materials.

This and other objects, features, and advantages in accordance with the present invention are provided by a method for making an integrated circuit which may include forming at least one active optical device and a waveguide coupled thereto. The waveguide may include a superlattice including a plurality of stacked groups of layers. More specifically, each group of layers of the superlattice may include a plurality of stacked base semiconductor monolayers defining a base semiconductor portion and an energy band-modifying layer thereon. The energy-band modifying layer may include at least one non-semiconductor monolayer constrained within a crystal lattice of adjacent base semiconductor portions.

In addition, forming the waveguide may further include forming a layer on the superlattice, such as an epitaxial silicon layer, for example. Also, forming the waveguide may further include forming the superlattice to have an increased thickness adjacent the at least one active optical device. The at least one active optical device may be an optical transmitter and/or an optical receiver, for example.

The superlattice may have a common energy band structure therein, and the superlattice may have a higher charge carrier mobility than would otherwise be present without the at least one non-semiconductor monolayer. By way of example, each base semiconductor portion may comprise at least one of silicon and germanium, and each energy band-modifying layer may comprise oxygen.

Additionally, each energy band-modifying layer may be a single monolayer thick, and each base semiconductor portion may be less than eight monolayers thick, for example. The superlattice may also have a substantially direct energy bandgap, and it may further include a base semiconductor cap layer on an uppermost group of layers. Each energy band-modifying layer may include a non-semiconductor selected from the group consisting of oxygen, nitrogen, fluorine, and carbon-oxygen, for example.

DETAILED DESCRIPTION OF THE PREFERRED EMBODIMENTS

Figure 1:
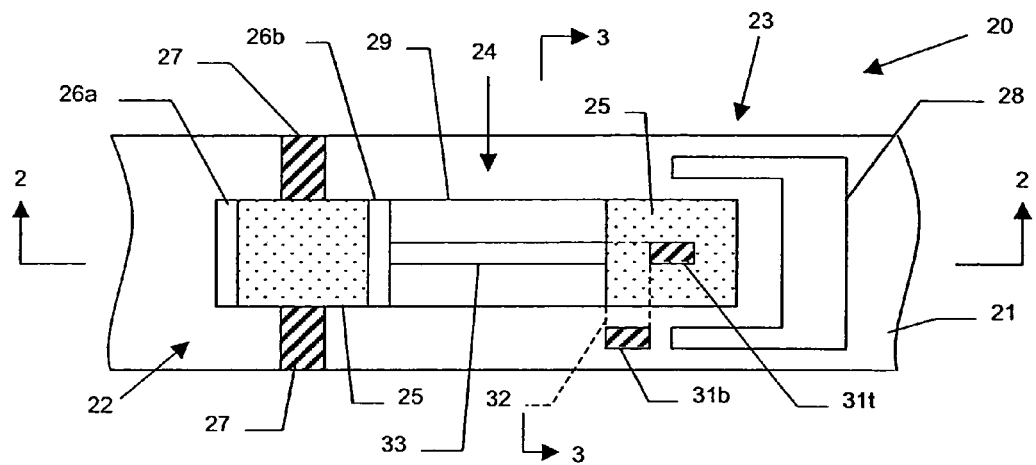
FIG. 1 is a top plan view of an integrated circuit in accordance with the present invention including active optical devices and a waveguide having an energy band engineered superlattice.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices as well as in optical devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} f(E(k,n), E_F, T) d^3k}$$

for electrons and:

$$M_{h,ij}^{-1}(E_F, T) = \frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. Moreover, these superlattices also may advantageously be configured to provide direct band gaps and, thus, desired optical transmission characteristics.

The inverse of the appropriate tensor element is referred to as the conductivity effective mass. In other words, to characterize semiconductor material structures, the conductivity effective mass for electrons/holes as described above and calculated in the direction of intended carrier transport may be used to distinguish improved materials.

Figure 2A:
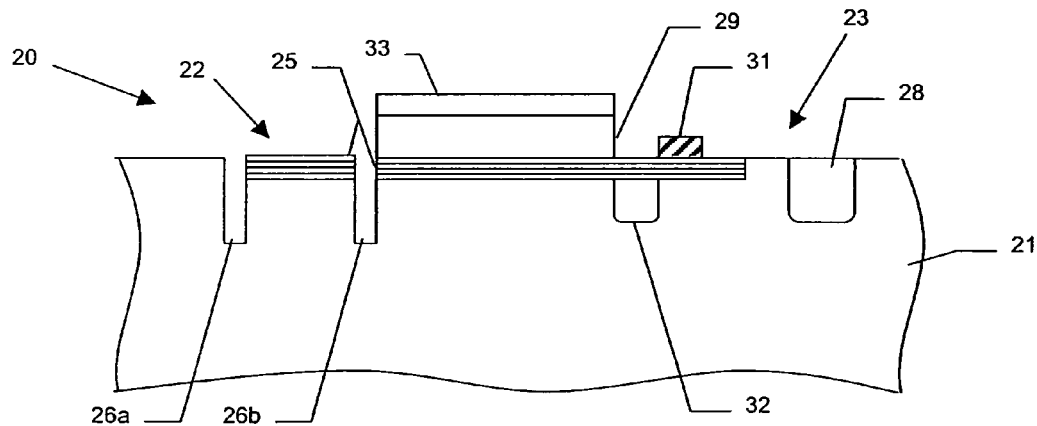
FIG. 2A is a schematic cross-sectional view of the integrated circuit of FIG. 1 taken along line 2—2.

Using the above-described measures, one can select materials having improved band structures for specific purposes. One such example would be a superlattice 25 material for use in optical elements in a semiconductor device, such as the integrated circuit 20 illustrated in FIGS. 1 and 2A. The integrated circuit 20 illustratively includes two active optical devices formed in a semiconductor substrate 21 (e.g., silicon). The first active optical device is an optical transmitter 22, and the second optical device is an optical receiver 23. Furthermore, a waveguide 24 is coupled between the optical transmitter 22 and the optical receiver 23. In the illustrated embodiment, each of the optical transmitter 22, optical receiver 23, and waveguide 24 includes the superlattice material 25, which will be described further below. The superlattice material 25 is shown with stippling in FIG. 1 for clarity of illustration.

It should be noted that the superlattice material 25 need not be used in each of the optical transmitter 22, optical receiver 23, and waveguide 24 in all embodiments. For example, the superlattice material 25 may be used solely in the optical transmitter 22 and/or receiver 23, or it may be used in the waveguide 24 with or without being used in either of the optical transmitter or receiver. Furthermore, while only a single optical transmitter 22, optical receiver 23, and waveguide 24 are shown for clarity of illustration, it will be appreciated by those skilled in the art that numerous such devices may be included within the integrated circuit 20. On the other hand, in some embodiments a single type of active optical device may be included in the semiconductor device 20, and there may be one or more of such devices.

In the illustrated embodiment, the superlattice material portion of the optical transmitter 22 defines an optical emission region of the optical transmitter which is coupled to the waveguide 24. The optical transmitter 22 also illustratively includes a pair of facets 26a, 26b and conductive contacts 27 (e.g., metal or silicide contacts) adjacent the optical emission region to define a laser light transmitter. It should be noted that, while the contacts 27 are not shown in section in FIG. 1, they are hatched for clarity of illustration.

More particularly, the optical emission region and facets 26a, 26b define an optical cavity that contains photons emitted when a voltage is applied across the contacts 27. The first facet 26a is located on the side of the optical emission region opposite the waveguide 24, and it is made to reflect the photons. The facet 26b, on the other hand, is positioned between the optical emission region and the waveguide 24, and it is made partially reflecting so that some radiation can escape from the cavity into the waveguide, as will be appreciated by those skilled in the art. It should be noted that various other optical transmission configurations may be used. By way of example, the optical transmitter 22 may be a light emitting diode (LED).

In the optical receiver 23, the superlattice material 25 defines an optical detector region which is illustratively coupled to the waveguide 24. The optical detector region receives the photons emitted from the optical emission region of the optical transmitter 22 via the waveguide 24, which may then be detected as a voltage across top and bottom contacts 31t, 31b (e.g., metal or silicide contacts) coupled to the optical detector region. Moreover, if desired, the optical receiver 23 may further include a light absorbing region 28 which is doped in the substrate 21 adjacent the optical detector for absorbing scattered light, as will be appreciated by those skilled in the art.

The bottom contact 31b may be a metal via which is electrically connected to the bottom portion of the superlattice 25 in the optical detection region through a doped contact region 32. However, those skilled in the art will appreciate that numerous contact arrangements are possible for both the optical transmitter 22 and the optical receiver 23 (e.g., top/bottom, front-back, side contacts), depending upon the given implementation.

Figure 16:
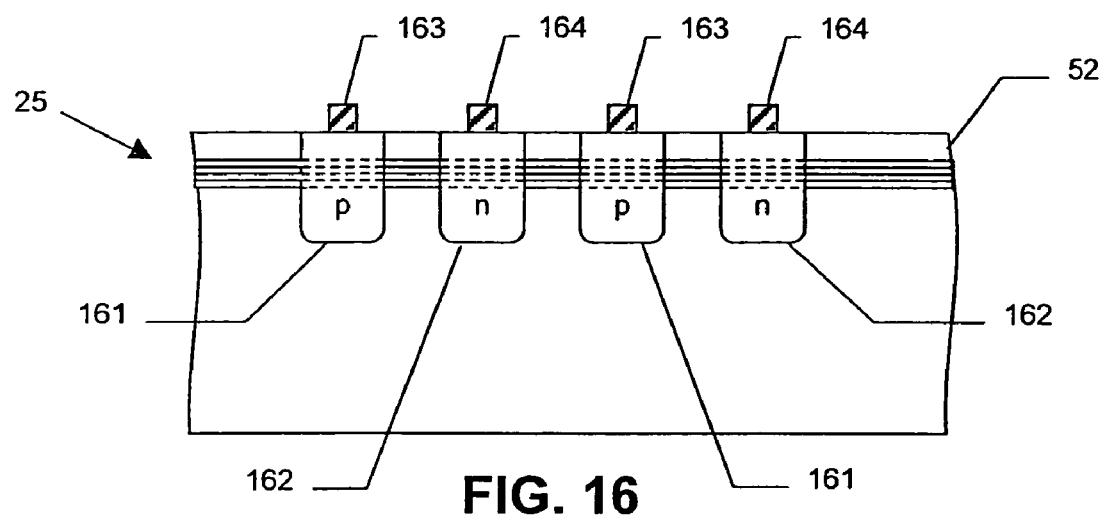
FIGS. 16 and 17 are cross-sectional views illustrating alternate contact configurations for the optical detector region of the integrated circuit of FIG. 1.
Figure 17:
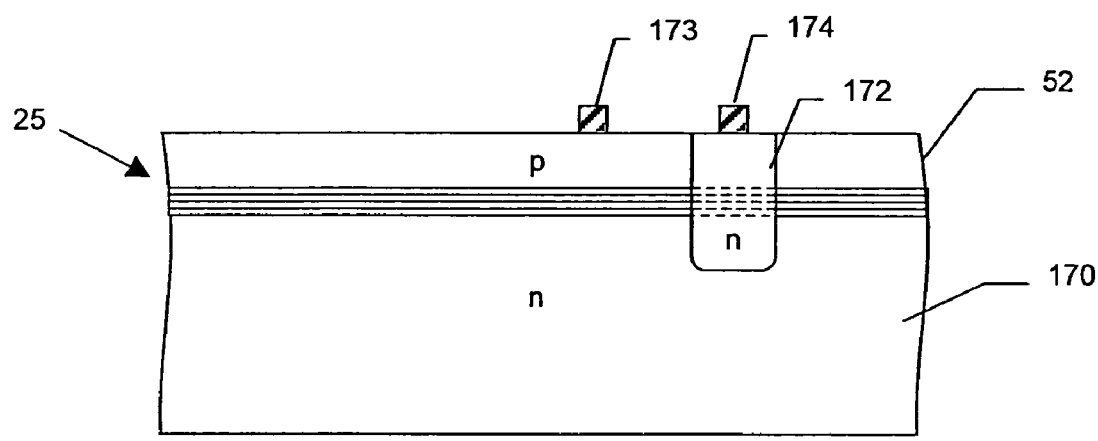

By way of example, several additional contact configurations are illustrated in FIGS. 16–18. More particularly, an optical detection region is illustrated in FIG. 16 in which the superlattice 25 is formed on a substrate 160, and a plurality of back-to-back p-type and n-type regions 161, 162, respectively, are doped through the superlattice into the substrate. The superlattice 25 is shown with dashed lines in the areas where doping has occurred for clarity of illustration. Contacts 163, 164 (e.g., metal or silicide) are respectively formed on the top of the p-type and n-type regions 161, 162. In operation, the p-n regions 161, 162 are reverse-biased and conduct when photons arrive in the depletion regions therebetween, creating charge carriers in the superlattice 25, as will be appreciated by those skilled in the art. Using a plurality of p-n regions advantageously allows more light to be captured, which may be desirable in certain embodiments where a relatively small thickness of the superlattice 25 is used.

Another embodiment is illustrated in FIG. 17, in which the superlattice 25 is formed on a substrate 170 having a first conductivity type (e.g., n-type). A top cap layer 52 of the superlattice 25, which is described further below, is implanted with an impurity of a second conductivity type (e.g., p-type). Further, a contact region 172 of the first conductivity type is doped through the superlattice 25 to the substrate 170, which provides a bottom contact to the superlattice. A contact 173 is formed on the cap layer 52 to provide a top contact for the superlattice 25, and a contact 174 is also formed on the contact region 172.

Figure 18A:
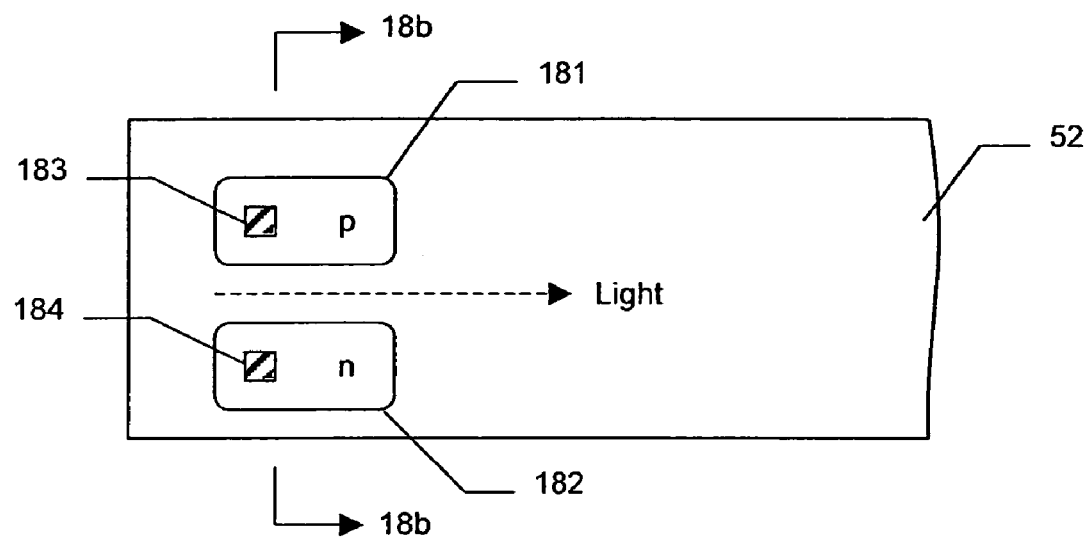
FIG. 18A is a top-plan view of another alternate contact configuration for the optical detector region of the integrated circuit of FIG. 1.
Figure 18B:
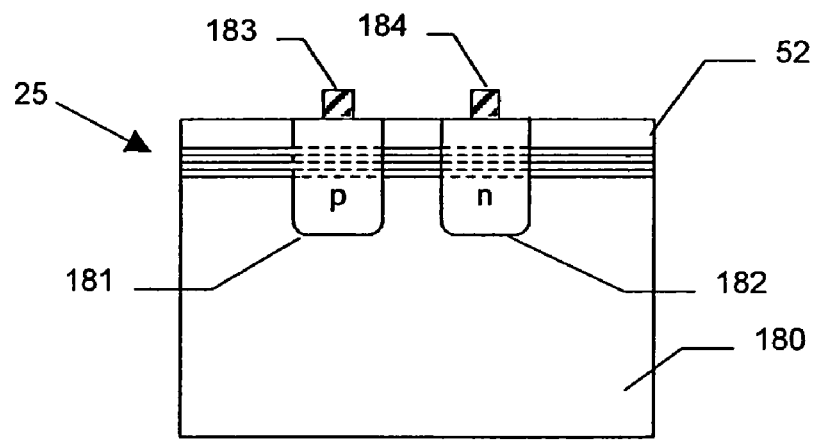
FIG. 18B is a cross-sectional view of the optical detector of FIG. 18A taken along line 18B—18B.

Yet another embodiment is illustrated in FIGS. 18A and 18B, in which a p-type contact region 181 and an n-type contact region 182 are formed in a substrate 180 (e.g., n-type) in parallel with the path light travels through the superlattice 25, as shown with a dashed arrow in FIG. 18A. Again, contact regions 183 and 184 are respectively formed on the p and n-type contact regions 181, 182.

From the foregoing it will be appreciated by those skilled in the art that the contact regions may advantageously be configured in numerous ways relative to the given orientation of the superlattice 25 and the direction of light propagation depending upon the particular implementation. Generally speaking, it is desirable to minimize the distance that light has to pass through the doped regions to avoid signal loss, as will be appreciated by those skilled in the art. Also, while the foregoing contact configurations were described with reference to optical receivers, it will be appreciated that they may be used for optical transmitters as well.

While the superlattice 25 is shown as being substantially lateral or parallel to the upper surface of the substrate in the above-noted embodiments, the superlattice may also be substantially vertically oriented (i.e., perpendicular to the upper surface of the substrate) in other embodiments, for example, and the contact regions configured accordingly.

Figure 2B:
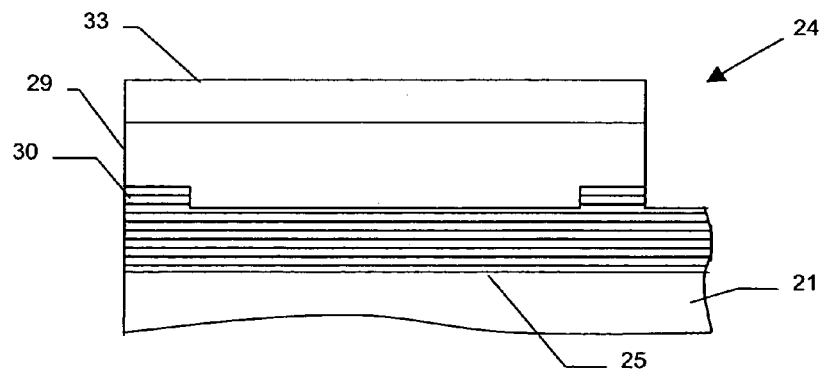
FIG. 2B is an enlarged schematic cross-sectional view illustrating an alternate embodiment of the waveguide of the integrated circuit of FIG. 2A.

As noted above, the waveguide 24 transports the photons generated by the optical transmitter 22 to the optical receiver 23. In the embodiment illustrated in FIG. 1, the waveguide 24 is a rib waveguide including an upper layer 29 on the superlattice material 25 defining a rib 33. By way of example, the layer 29 may be an epitaxial silicon layer (or layers) grown on top of the superlattice 25 (or it could be the cap layer of the superlattice). In certain embodiments, it may be desirable to increase the thickness of the superlattice material 25 adjacent the optical transmitter 22 and/or optical receiver 23 to facilitate alignment of the various components, as shown in the enlarged view of FIG. 2B.

Figure 3:
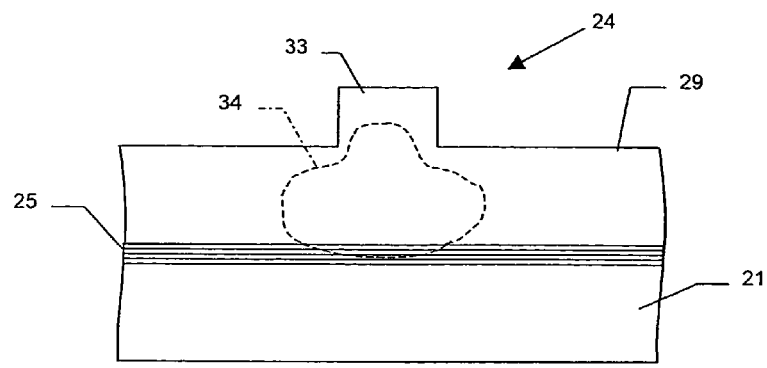
FIG. 3 is a cross-sectional end view of the integrated circuit of FIG. 1 taken along line 3—3 and illustrating the waveguide thereof.

A cross-sectional view of the rib waveguide 24 is illustrated in FIG. 3. The light transmission field 34 is shown with dashes and extends within the rib 33, layer 29, and into the superlattice 25. For the illustrated example, the superlattice 25 of the waveguide 24 may be about 500 nm in thickness, while the layer 29 and rib 33 may be about 2 to 4 μm thick, although other dimensions may also be used.

Figure 19A:
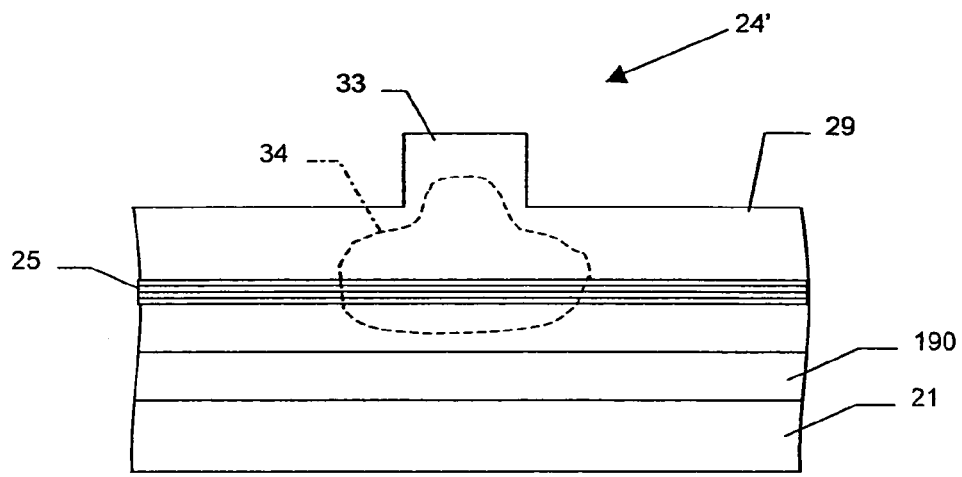
FIGS. 19A–19C are cross-sectional views illustrating alternate embodiments of the waveguide of FIG. 3.
Figure 19B:
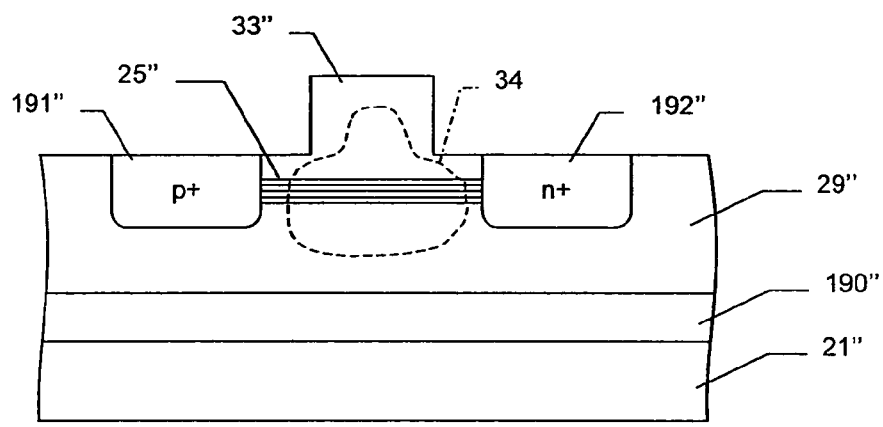
Figure 19C:
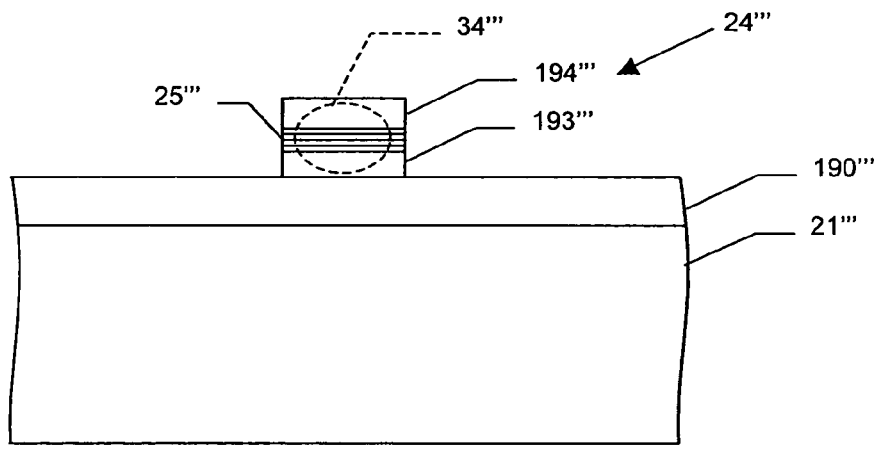

Another similar waveguide 24' is illustrated in FIG. 19A. The waveguide 24' is also a rib waveguide, but rather than being formed directly on the substrate 21' it is instead formed on an insulating layer 190' (e.g., silicon dioxide) to provide a silicon-on-insulator (SOI) implementation, as will be appreciated by those skilled in the art. Another SOI rib waveguide 24" is illustrated in FIG. 19B. Here, p+ and n+ regions 191", 192" are included for biasing the superlattice 25", which extends therebetween. Yet another exemplary waveguide embodiment is illustrated in FIG. 19C. The waveguide 24''' is a ridge waveguide, where the ridge is made up a vertical stack of top and bottom semiconductor (e.g., silicon or germanium) layers 193''', 194''' with the superlattice 25''' therebetween. The ridge may optionally be formed on the insulating layer 190''', if desired.

It will be appreciated by those skilled in the art that numerous configurations of elements may be used to provide different features in different embodiments. For example, a single optical transmitter 22 could be used to distribute clock and/or data signals optically to numerous other components of the integrated circuit 20. For example, the waveguide 24 may be configured in a network, such as an H-tree network, to distribute clock and/or data signals to a plurality of optical receivers 23 distributed throughout the integrated circuit 20, as will be appreciated by those skilled in the art. Moreover, the waveguide 24 including the superlattice 25 may also advantageously be used for providing voltage isolation between components, i.e., as an opto-isolator. This may be particularly important where high voltage components are included in the integrated circuit 20.

Figure 4:
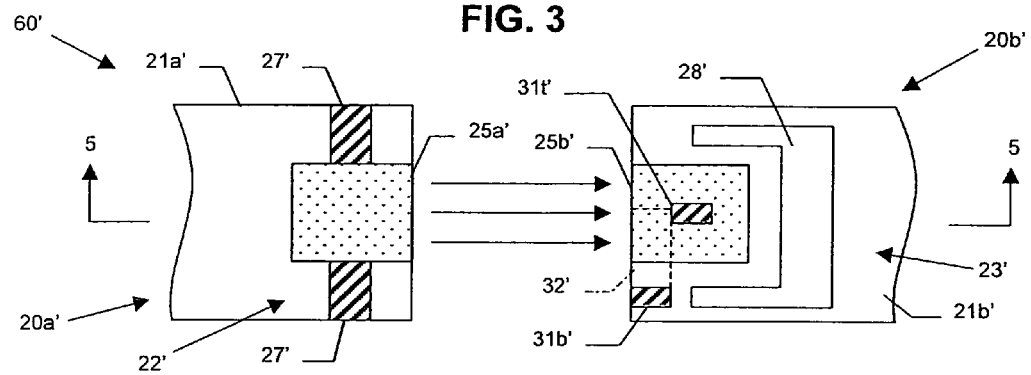
FIG. 4 is a top plan view of an electronic device in accordance with the present invention including first and second integrated circuits each having an active optical element with an energy band engineered superlattice.
Figure 5:
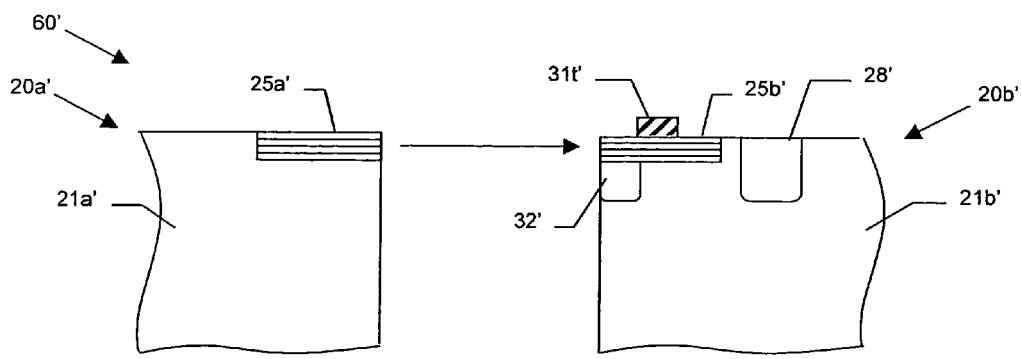
FIG. 5 is a schematic cross-sectional view of the electronic device of FIG. 4 taken along line 5—5.

While the integrated circuit 20 advantageously provides "on-chip" optical communications between the optical transmitter 22 and optical receiver 23, multiple integrated circuits may be combined in accordance with the present invention to also provide off-chip or between-chip optical communications. Referring to FIGS. 4 and 5, an electronic device 60' illustratively includes a first integrated circuit 20a' having an optical transmitter 22', and a second integrated circuit 20b' having an optical receiver 23'. In the illustrated embodiment, the optical transmitter 22' includes an optical emission region defined by the superlattice 25a' and contacts 27' coupled thereto. Here, the optical emission region is positioned adjacent an edge of the integrated circuit 20a' to provide an edge emitting device as shown.

The first and second integrated circuits 20a', 20b' are positioned relative to one another so that the optical transmitter 22' and optical receiver 23' are aligned to establish an optical communications link therebetween. In the exemplary embodiment, the optical communications link is a free space optical (FSO) communications link, as shown. However, a waveguide or other optical elements/devices (e.g., lenses, mirrors, etc.) may also be coupled in the optical path between the optical transmitter 22' and optical receiver 23' in certain embodiments, if desired.

Figure 6:
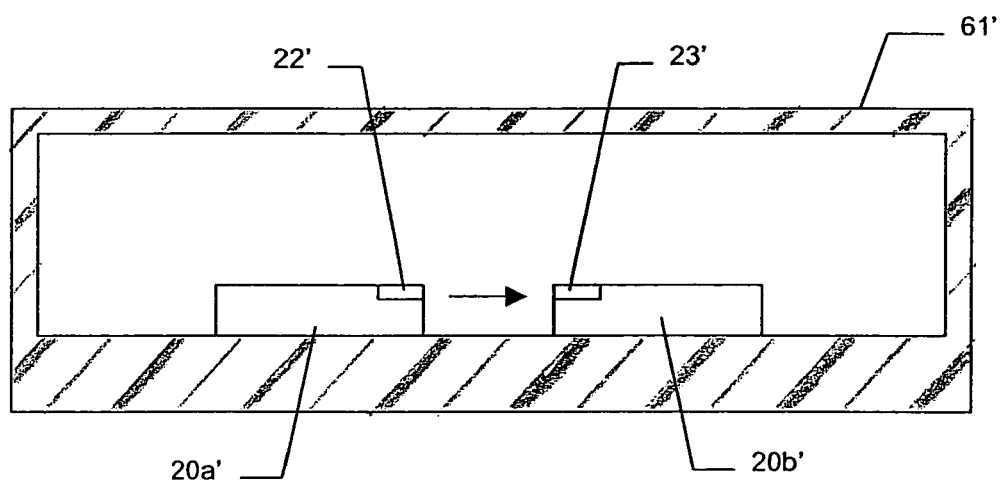
FIG. 6 is a schematic cross-sectional view illustrating the electronic device of FIG. 4 implemented in a multi-chip module.

Moreover, it should be noted that configurations other than edge emitting/receiving devices may also be used. By way of example, the optical transmitter 22' may be a vertical surface emitting device. Various optical elements/devices may also be used with such a surface emitting configuration, such as a hologram grating and/or mirror, for example, as will be appreciated by those skilled in the art. In one particularly advantageous embodiment, the electronic device 60' may be implemented in a multi-chip module 61' (FIG. 6), as will be appreciated by those skilled in the art, although other configurations may also be used.

Figure 7:
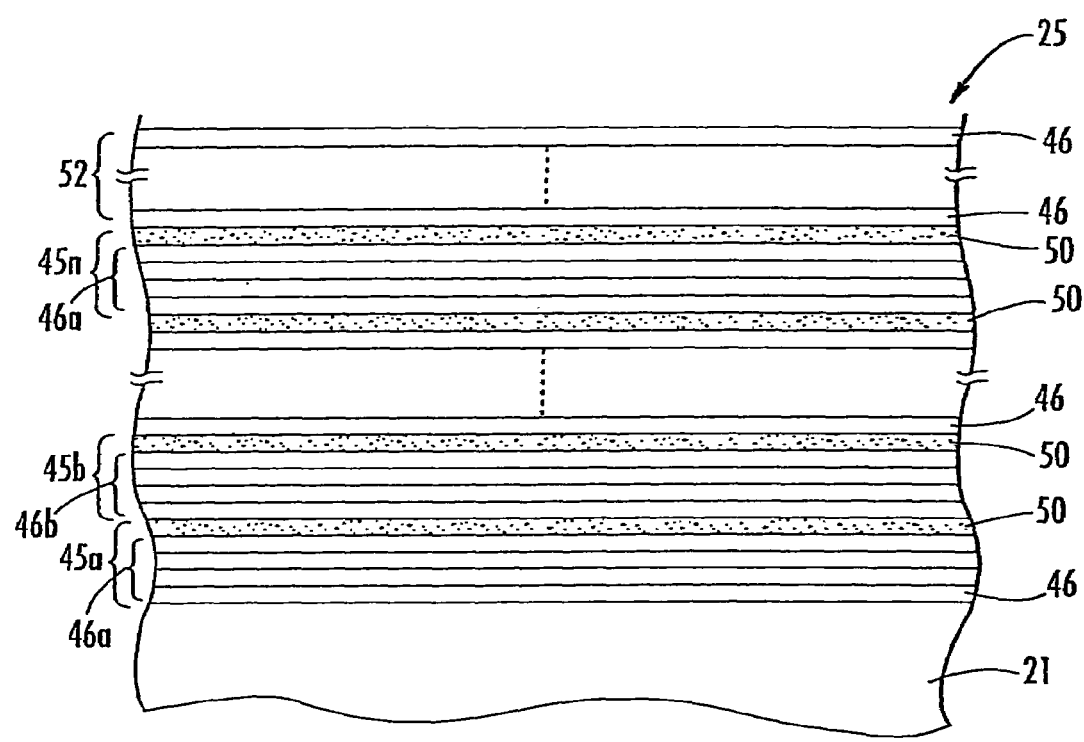
FIG. 7 is a greatly enlarged schematic cross-sectional view of the superlattice material used in the integrated circuits of FIGS. 1 and 4.
Figure 8:
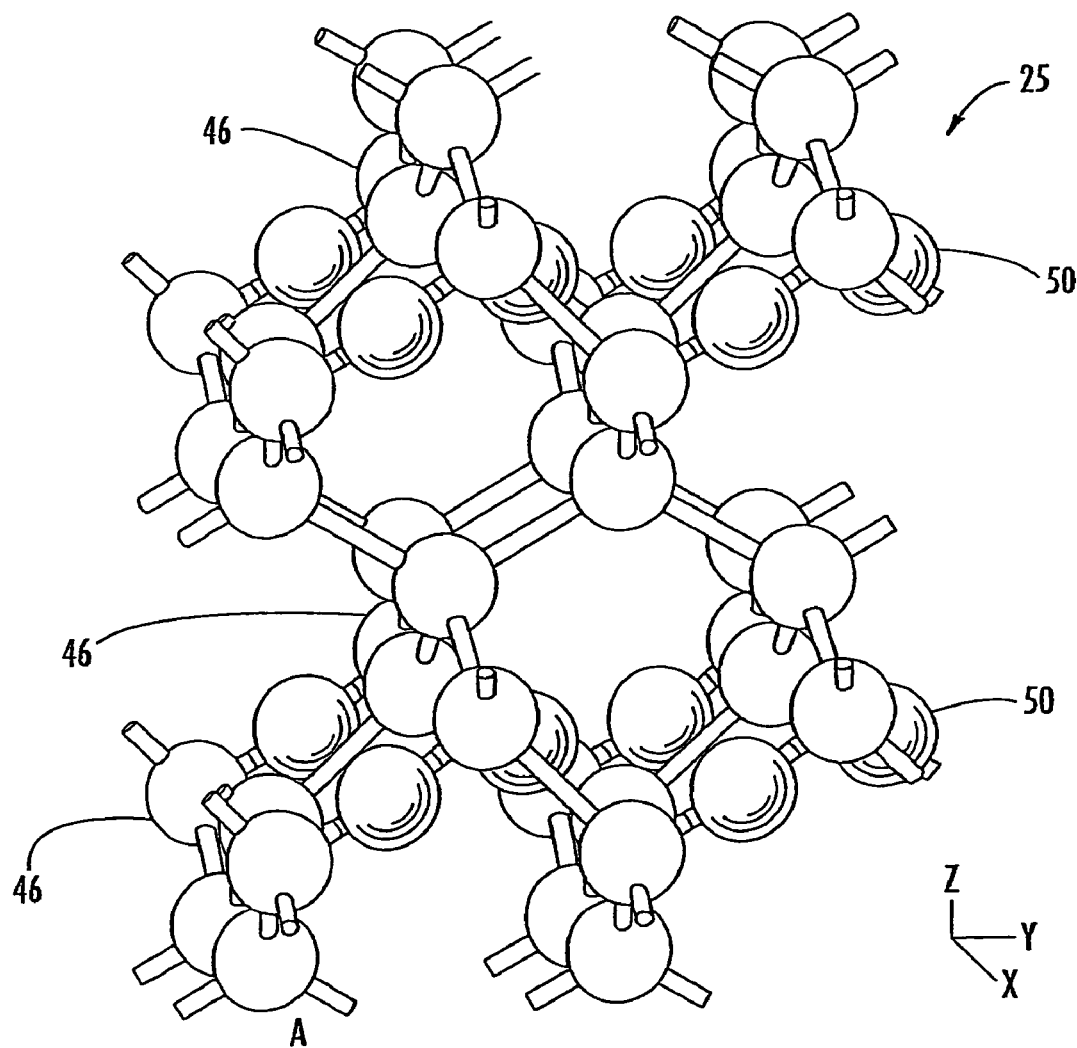
FIG. 8 is a perspective schematic atomic diagram of a portion of the superlattice material used in the integrated circuits of FIGS. 1 and 4.

Referring additionally to FIGS. 7 and 8, the superlattice 25 for use in the integrated circuit 20 is now further described. The materials/structures used to form the superlattice 25, whose structure is controlled at the atomic or molecular level, may be formed using known techniques of atomic or molecular layer deposition. The superlattice 25 includes a plurality of layer groups 45a–45n arranged in stacked relation, as perhaps best understood with specific reference to the schematic cross-sectional view of FIG. 7.

Each group of layers 45a–45n of the superlattice 25 illustratively includes a plurality of stacked base semiconductor monolayers 46 defining a respective base semiconductor portion 46a–46n and an energy band-modifying layer 50 thereon. The energy band-modifying layers 50 are indicated by stippling in FIG. 7 for clarity of illustration.

The energy-band modifying layer 50 illustratively includes one non-semiconductor monolayer constrained within a crystal lattice of adjacent base semiconductor portions. In other embodiments, more than one such monolayer may be possible. It should be noted that reference herein to a non-semiconductor/semiconductor monolayer means that the material used for the monolayer would be a non-semiconductor/semiconductor if formed in bulk. That is, a single monolayer of material, such as a semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a–46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure.

As a result of the band engineering achieved by the present invention, the superlattice 25 may have a substantially direct energy bandgap, which is particularly advantageous for opto-electronic devices, as discussed further below. As will be appreciated by those skilled in the art, transportation of charge carriers through the superlattice is in a parallel direction relative to the layers of the stacked groups 45a–45n.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a–46n may comprise a base semiconductor selected from the group consisting of Group IV semiconductors, Group III–V semiconductors, and Group II–VI semiconductors of course, the term Group IV semiconductors also includes Group IV–IV semiconductors, as will be appreciated by those skilled in the art. More particularly, the base semiconductor material may comprise at least one of silicon and germanium, for example Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 8, a 4/1 repeating structure is illustrated for silicon as the base semiconductor material, and oxygen as the energy band-modifying material. Only half of the possible sites for oxygen are occupied. In other embodiments and/or with different materials this one half occupation would not necessarily be the case, as will be appreciated by those skilled in the art. Indeed, it can be seen even in this schematic diagram that individual atoms of oxygen in a given monolayer are not precisely aligned along a flat plane, as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 7 and 8 for Si/O has been modeled to indicate an enhanced mobility for electrons and holes in the X direction. For example, the calculated conductivity effective mass for electrons (isotropic for bulk silicon) is 0.26, and for the 4/1 SiO superlattice in the X direction it is 0.12, resulting in a ratio of 0.46. Similarly, the calculation for holes yields values of 0.36 for bulk silicon and 0.16 for the 4/1 Si/O superlattice, resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 9:
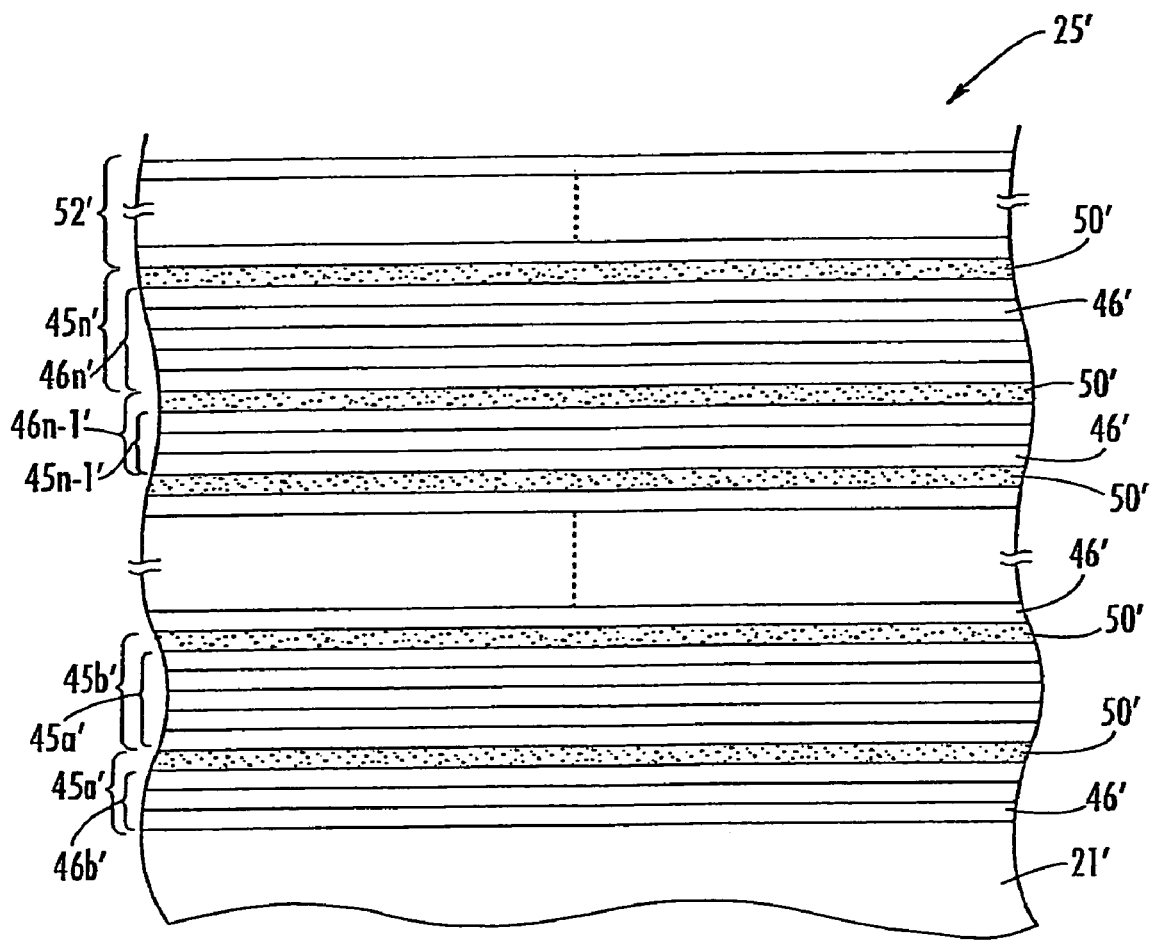
FIG. 9 is a greatly enlarged schematic cross-sectional view of another embodiment of a superlattice material that may be used in the integrated circuits of FIGS. 1 and 4.

Indeed, referring now additionally to FIG. 9, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 9 not specifically mentioned are similar to those discussed above with reference to FIG. 7 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 10A:
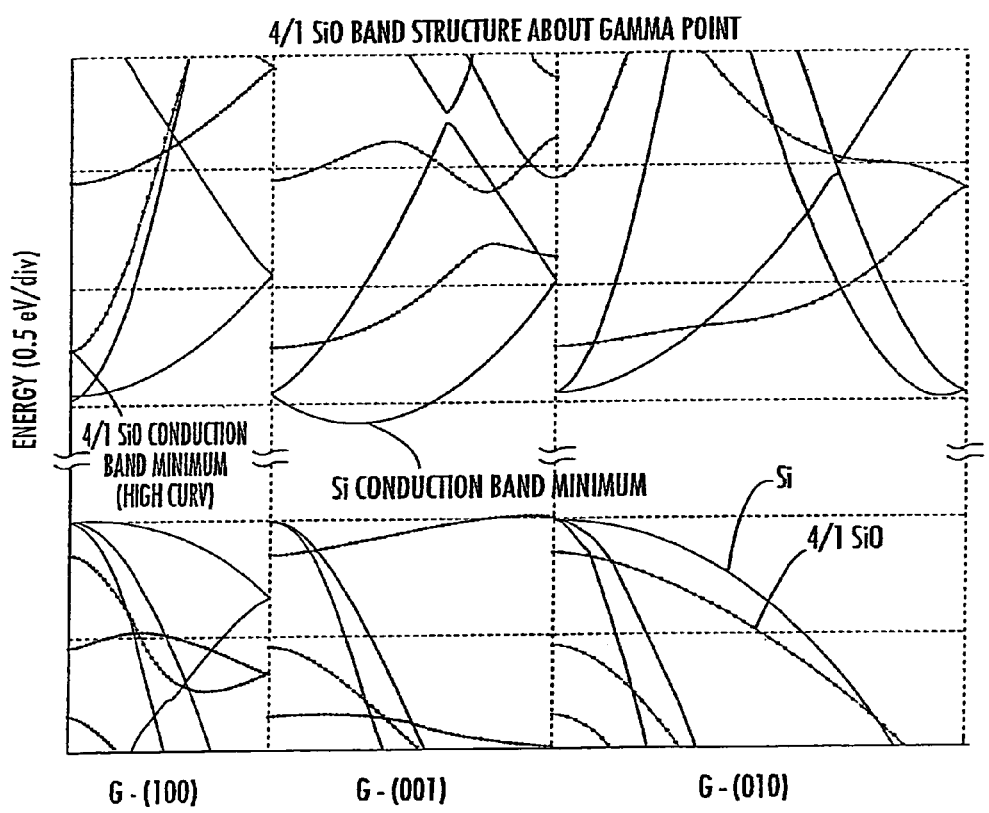
FIG. 10A is a graph of the calculated band structure from the gamma point (G) for both bulk silicon as in the prior art, and for the 4/1 Si/O superlattice as shown in FIGS. 7 and 8.
Figure 10B:
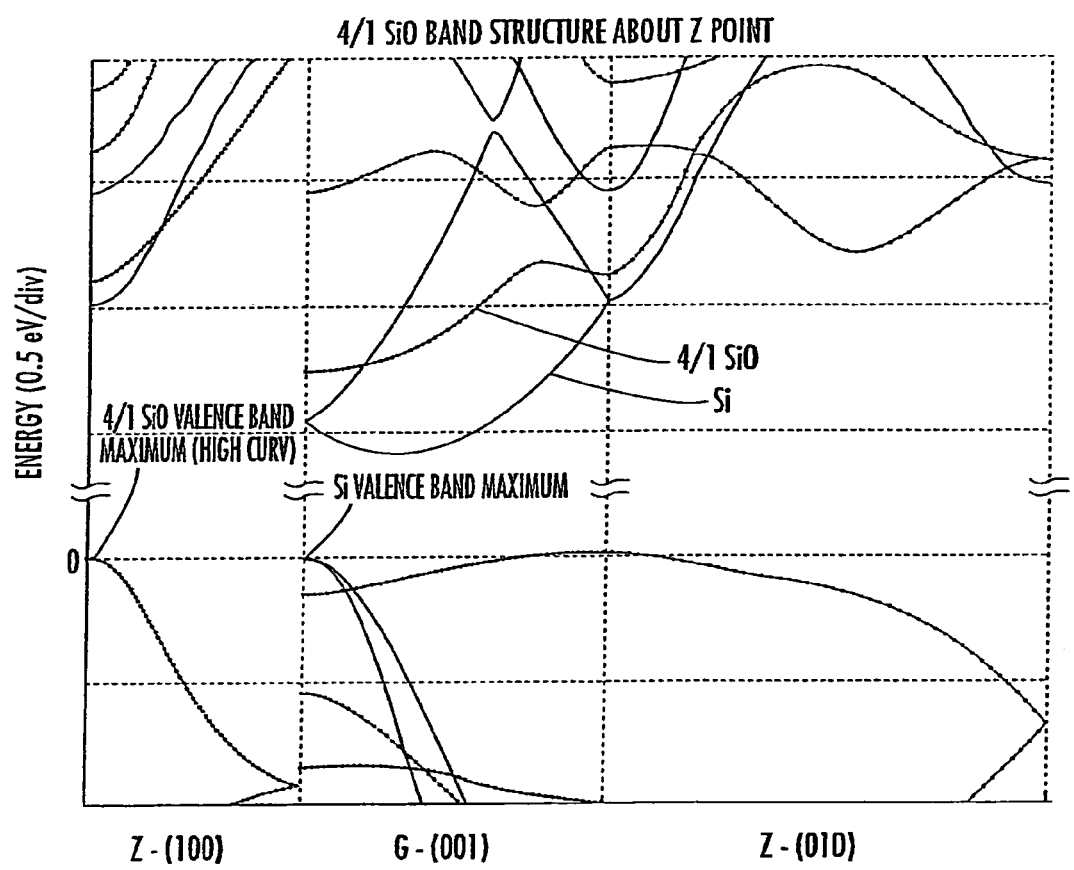
FIG. 10B is a graph of the calculated band structure from the Z point for both bulk silicon as in the prior art, and for the 4/1 Si/O superlattice as shown in FIGS. 7 and 8.
Figure 10C:
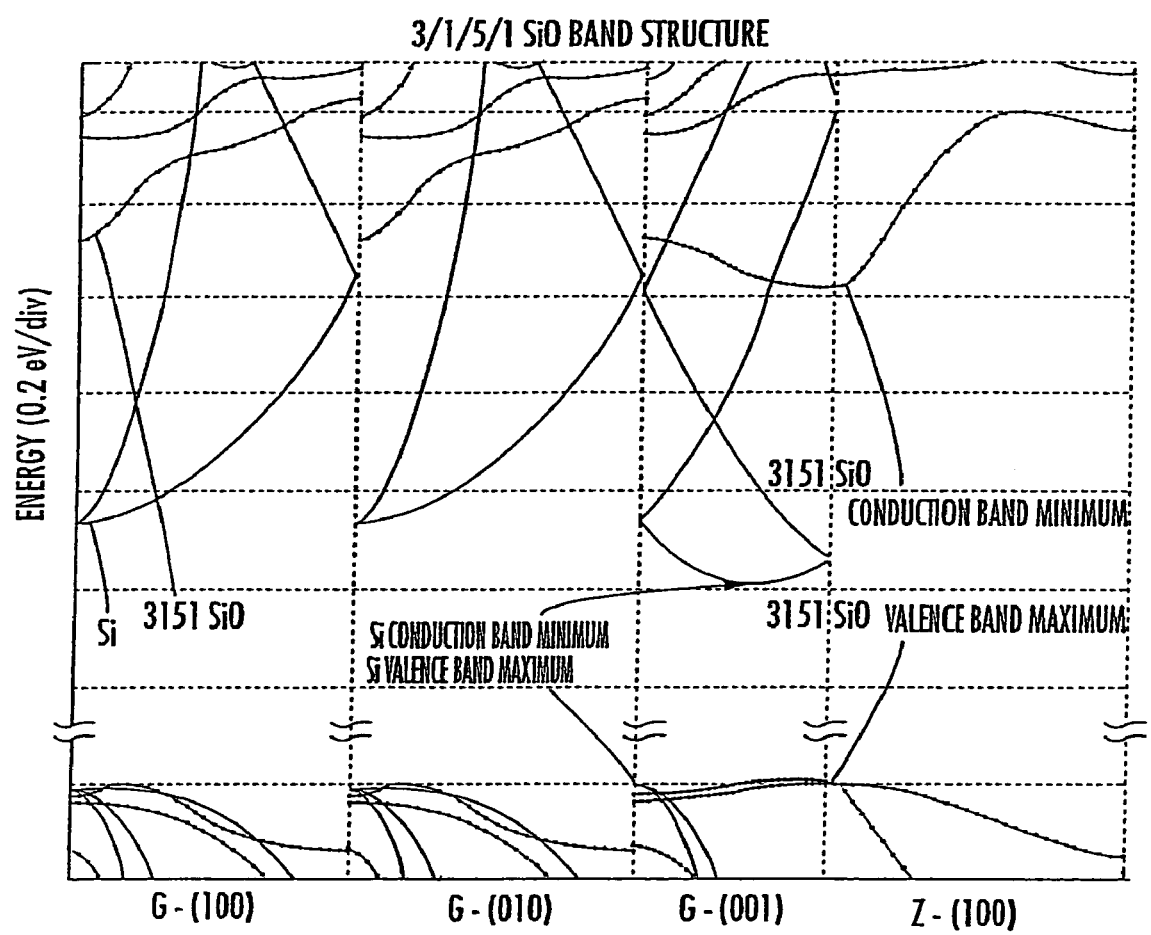
FIG. 10C is a graph of the calculated band structure from both the gamma and Z points for both bulk silicon as in the prior art, and for the 5/1/3/1 Si/O superlattice as shown in FIG. 9.

In FIGS. 10A–10C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 10A shows the calculated band structure from the gamma point (G) for both bulk silicon (represented by continuous lines) and for the 4/1 Si/O superlattice 25 as shown in FIGS. 7 and 8 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (–110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 10B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 10C shows the calculated band structure from the both the gamma and Z point for both bulk silicon (continuous lines) and for the 5/1/3/1 Si/O structure of the superlattice 25' of FIG. 9 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior, and thus may be used to distinguish improved materials.

Figure 11:
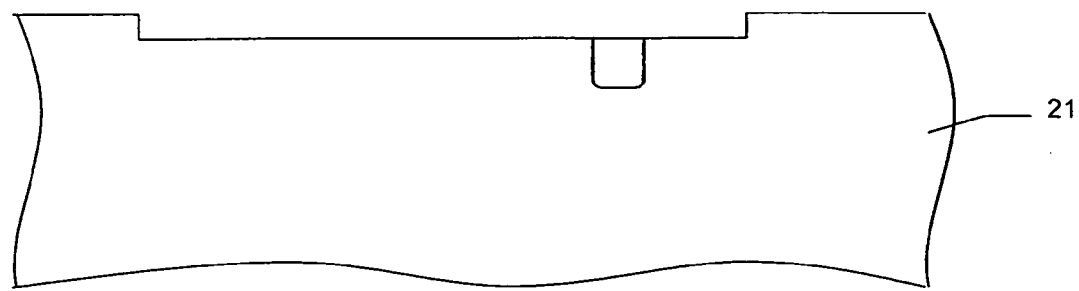
FIGS. 11–13 are schematic cross-sectional views illustrating a method for making the integrated circuit of FIG. 1.
Figure 12:
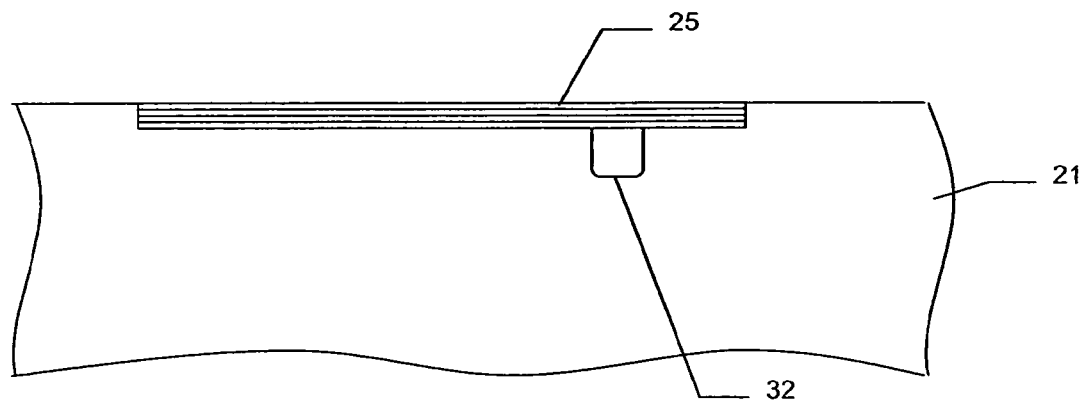
Figure 13:
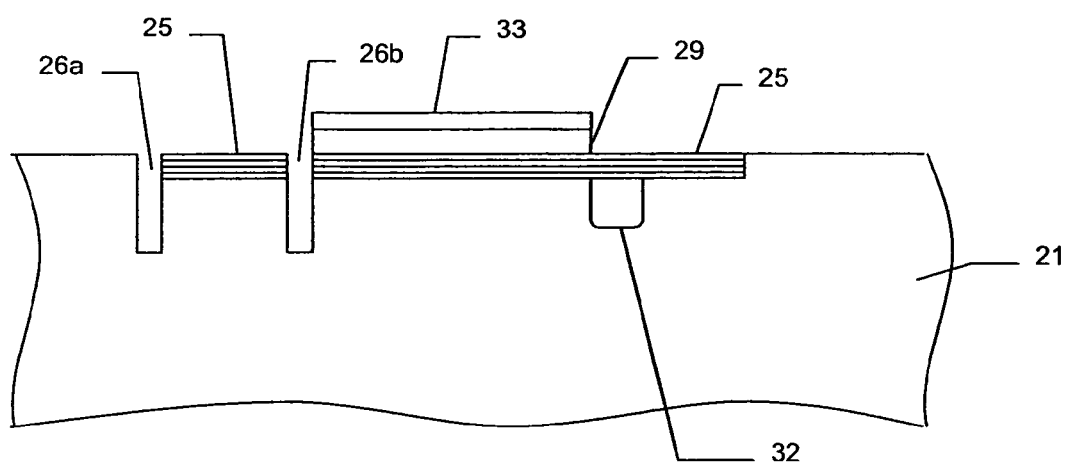

Turning to FIGS. 11–13, a method for making the integrated circuit 20 is now described. First, the semiconductor substrate 21 is etched to form a superlattice material 25 deposition region and the contact region 32 is doped. The superlattice 25 is then deposited in the etched region as described above. Of course, in some embodiments the superlattice 25 may be deposited on the surface of the substrate 21 without etching, as will be appreciated by those skilled in the art.

The epitaxial silicon layer 29 and rib 33 may then be formed on the superlattice material 25 and patterned, as shown in FIG. 13. More particularly, the epitaxial silicon layer may be patterned as part of the facet 26a, 26b formation process. The light absorbing region 28 may then be doped in the substrate 21 adjacent the portion of the superlattice 25 that is to define the optical detection region, and the contacts 27, 31t, 31b may be formed to provide the semiconductor 20 illustrated in FIGS. 1 and 2.

It will be appreciated by those skilled in the art that conventional semiconductor processing techniques may be used for performing the above-noted steps. Moreover, various steps may be performed in different orders in different embodiments. For example, the light absorbing region 28 may in some cases be doped before the superlattice material 25 is deposited or the facets 26a, 26b are formed.

Figure 14:
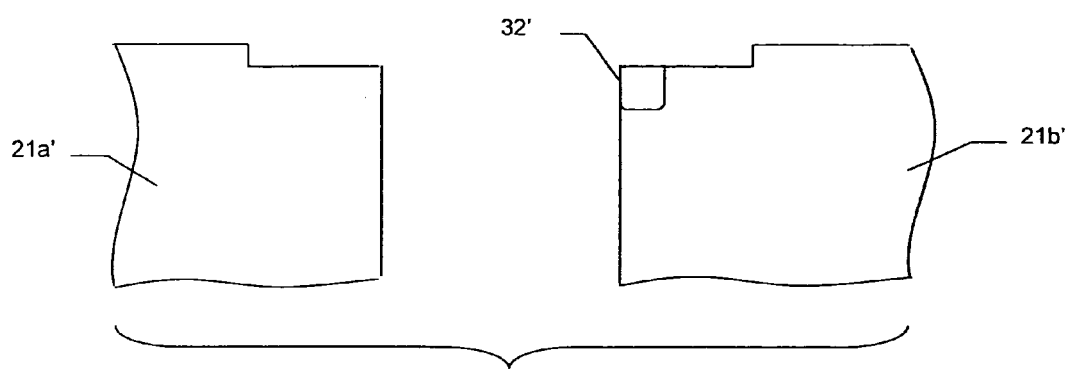
FIGS. 14–15 are schematic cross-sectional views illustrating a method for making the electronic device of FIG. 4.
Figure 15:
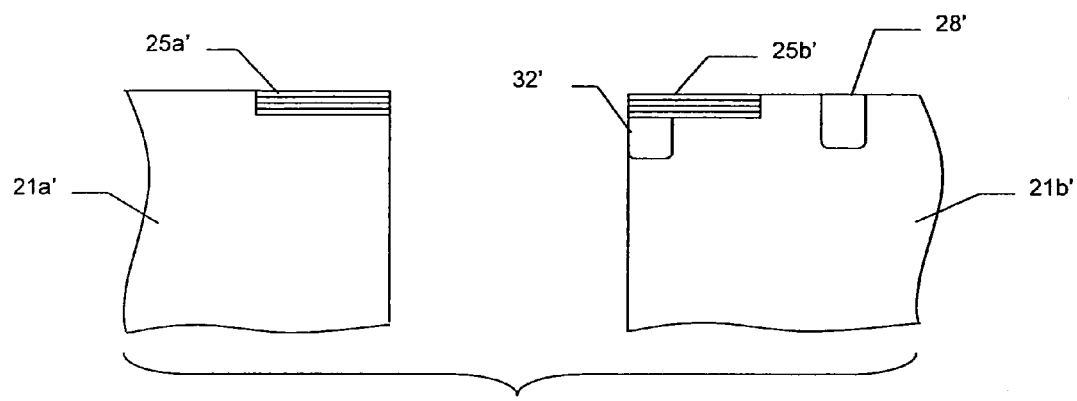

A method for making the electronic device 60' illustrated in FIGS. 4 and 5 is now described with reference to FIGS. 14–15. While the substrates 21a', 21b' are shown side-by-side for clarity of illustration in these figures, it will be appreciated that these substrates need not necessarily be processed simultaneously (i.e., the integrated circuits 20a', 20b' may be formed separately). However, in some embodiments it may be possible to form the device on a single substrate, similar to the steps described above with reference to FIGS. 10-12, and then divide the completed device into the two integrated circuits 20a', 20b' to form the electronic device 60'.

First, the substrates 21a', 21b' are etched to form superlattice deposition regions and the contact region 32' is doped, as discussed above. Once the superlattice deposition regions are formed, the superlattice portions 25a', 25b' are formed therein, as discussed above. The light absorbing region 28' may then be doped, and the contacts 27', 31t', 31b' are formed to complete the integrated circuits 20a', 20b'. Here again, conventional semiconductor processing techniques may be used for the above-noted steps, and various steps may also be performed in different orders in different embodiments, as will be appreciated by those skilled in the art.

Additional features of the invention may be found in applications entitled INTEGRATED CIRCUIT COMPRISING AN ACTIVE OPTICAL DEVICE HAVING AN ENERGY BAND ENGINEERED SUPERLATTICE, Ser. No. 10/936,903; METHOD FOR MAKING AN INTEGRATED CIRCUIT COMPRISING AN ACTIVE OPTICAL DEVICE HAVING AN ENERGY BAND ENGINEERED SUPERLATTICE, application Ser. No. 10/936,933; ELECTRONIC DEVICE COMPRISING ACTIVE OPTICAL DEVICES WITH AN ENERGY BAND ENGINEERED SUPERLATTICE, application Ser. No. 10/937,072; and INTEGRATED CIRCUIT COMPRISING A WAVEGUIDE HAVING AN ENGINEERED SUPERLATTICE, application Ser. No. 10/937,071, the entire disclosures of which are hereby incorporated herein by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making an integrated circuit comprising:
    forming at least one active optical device and a waveguide coupled thereto, the waveguide comprising a superlattice including a plurality of stacked groups of layers;
    each group of layers of the superlattice comprising a plurality of stacked base semiconductor monolayers defining a base semiconductor portion and an energy band-modifying layer thereon, the energy-band modifying layer comprising at least one non-semiconductor monolayer constrained within a crystal lattice of adjacent base semiconductor portions.

2. The method of claim 1 wherein forming the waveguide further comprises forming a layer on the superlattice.

3. The method of claim 2 wherein the layer comprises an epitaxial silicon layer.

4. The method of claim 1 wherein forming the waveguide further comprises forming the superlattice to have an increased thickness adjacent the at least one active optical device.

5. The method of claim 1 wherein the at least one active optical device comprises an optical transmitter.

6. The method of claim 1 wherein the at least one active optical device comprises an optical receiver.

7. The method of claim 1 wherein the superlattice has a common energy band structure therein.

8. The method of claim 1 wherein the superlattice has a higher charge carrier mobility than would otherwise be present without the at least one non-semiconductor monolayer.

9. The method of claim 1 wherein each base semiconductor portion comprises silicon.

10. The method of claim 1 wherein each base semiconductor portion comprises germanium.

11. The method of claim 1 wherein each energy band-modifying layer comprises oxygen.

12. The method of claim 1 wherein each energy band-modifying layer is a single monolayer thick.

13. The method of claim 1 wherein each base semiconductor portion is less than eight monolayers thick.

14. The method of claim 1 wherein the superlattice further has a substantially direct energy bandgap.

15. The method of claim 1 wherein the superlattice further comprises a base semiconductor cap layer on an uppermost group of layers.

16. The method of claim 1 wherein each energy band-modifying layer comprises a non-semiconductor selected from the group consisting of oxygen, nitrogen, fluorine, and carbon-oxygen.

17. A method for making an integrated circuit comprising:
forming at least one active optical device, and forming a waveguide coupled to the at least one active optical device by
forming a first layer comprising a superlattice including a plurality of stacked groups of layers, and
forming a second layer on the first layer;
each group of layers of the superlattice comprising a plurality of stacked base semiconductor monolayers defining a base semiconductor portion and an energy band-modifying layer thereon, the energy-band modifying layer comprising at least one non-semiconductor monolayer constrained within a crystal lattice of adjacent base semiconductor portions, and the superlattice having a higher charge carrier mobility than would otherwise be present without the at least one non-semiconductor monolayer.

18. The method of claim 17 wherein forming the first layer comprises forming the first layer to have an increased thickness adjacent the at least one active optical device.

19. The method of claim 17 wherein the second layer comprises an epitaxial silicon layer.

20. The method of claim 17 wherein the at least one active optical device comprises an optical transmitter.

21. The method of claim 17 wherein the at least one active optical device comprises an optical receiver.

22. The method of claim 17 wherein the superlattice has a common energy band structure therein.

23. The method of claim 17 wherein each base semiconductor portion comprises silicon.

24. The method of claim 17 wherein each base semiconductor portion comprises germanium.

25. The method of claim 17 wherein each energy band-modifying layer comprises oxygen.

26. The method of claim 17 wherein each energy band-modifying layer is a single monolayer thick.

27. The method of claim 17 wherein each base semiconductor portion is less than eight monolayers thick.

28. The method of claim 17 wherein the superlattice further has a substantially direct energy bandgap.

29. The method of claim 17 wherein the superlattice further comprises a base semiconductor cap layer on an uppermost group of layers.

30. The method of claim 17 wherein each energy band-modifying layer comprises a non-semiconductor selected from the group consisting of oxygen, nitrogen, fluorine, and carbon-oxygen.

* * * * *

UNITED STATES PATENT AND TRADEMARK OFFICE
CERTIFICATE OF CORRECTION

PATENT NO. : 7,109,052 B2
APPLICATION NO. : 10/936920
DATED : September 19, 2006
INVENTOR(S) : Mears et al.

Page 1 of 2

It is certified that error appears in the above-identified patent and that said Letters Patent is hereby corrected as shown below:

Column 1, Line 47    Delete: "or a binary"
Insert: -- or binary --

Column 4, Line 45    Delete "

$$M_{\varepsilon,i,j}^{-1}(E_F,T) = \frac{\sum_{E>E_F} \int_{BZ} (\nabla_k E(k,n))_i (\nabla_k E(k,n))_j \frac{\partial f(E(k,n),E_F,T)}{\partial E} d^3k}{\sum_{E<E_F} \int_{BZ} f(E(k,n),E_F,T) d^3k}$$

"

Insert: --

$$M_{\varepsilon,i,j}^{-1}(E_F,T) = \frac{\sum_{E>E_F} \int_{BZ} (\nabla_k E(k,n))_i (\nabla_k E(k,n))_j \frac{\partial f(E(k,n),E_F,T)}{\partial E} d^3k}{\sum_{E>E_F} \int_{BZ} f(E(k,n),E_F,T) d^3k}$$

--

Column 4, Line 55    Delete: "

$$M_{h,i,j}^{-1}(E_F,T) = \frac{-\sum_{E<E_F} \int_{BZ} (\nabla_k E(k,n))_i (\nabla_k E(k,n))_j \frac{\partial f(E(k,n),E_F,T)}{\partial E} d^3k}{\sum_{E>E_F} \int_{BZ} (1-f(E(k,n),E_F,T)) d^3k}$$

"

Insert: --

$$M_{h,i,j}^{-1}(E_F,T) = \frac{-\sum_{E<E_F} \int_{BZ} (\nabla_k E(k,n))_i (\nabla_k E(k,n))_j \frac{\partial f(E(k,n),E_F,T)}{\partial E} d^3k}{\sum_{E<E_F} \int_{BZ} (1-f(E(k,n),E_F,T)) d^3k}$$

--

UNITED STATES PATENT AND TRADEMARK OFFICE
CERTIFICATE OF CORRECTION

PATENT NO.        : 7,109,052 B2
APPLICATION NO.   : 10/936920
DATED             : September 19, 2006
INVENTOR(S)       : Mears et al.

It is certified that error appears in the above-identified patent and that said Letters Patent is hereby corrected as shown below:

Column 11, Lines 8-9    Delete: " from the both"
                        Insert: -- from both --

Signed and Sealed this

Twenty-fourth Day of April, 2007

JON W. DUDAS
*Director of the United States Patent and Trademark Office*